US006902993B2

(12) United States Patent
Blosse et al.

(10) Patent No.: US 6,902,993 B2
(45) Date of Patent: Jun. 7, 2005

(54) GATE ELECTRODE FOR MOS TRANSISTORS

(75) Inventors: Alain Blosse, Belmont, CA (US); Krishnaswamy Ramkumar, San Jose, CA (US); Prabhuram Gopalan, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 39 days.

(21) Appl. No.: 10/402,750

(22) Filed: Mar. 28, 2003

(65) Prior Publication Data

US 2004/0188772 A1 Sep. 30, 2004

(51) Int. Cl.$^7$ .......................................... H01L 21/3205
(52) U.S. Cl. ..................... 438/592; 257/72; 257/410; 257/413; 438/305; 438/682; 438/775
(58) Field of Search ................... 257/72, 410, 413; 438/287, 305, 682, 775, 592

(56) References Cited

U.S. PATENT DOCUMENTS

| | | | | | |
|---|---|---|---|---|---|
| 5,710,454 | A | * | 1/1998 | Wu | 257/413 |
| 6,251,777 | B1 | * | 6/2001 | Jeng et al. | 438/682 |
| 6,297,539 | B1 | * | 10/2001 | Ma et al. | 257/410 |
| 6,500,720 | B2 | * | 12/2002 | Kunikiyo | 438/305 |
| 6,509,254 | B1 | | 1/2003 | Matsumoto et al. | |
| 6,514,841 | B2 | * | 2/2003 | Kim et al. | 438/592 |
| 6,562,730 | B2 | * | 5/2003 | Jeng | 438/775 |

OTHER PUBLICATIONS

R. Malik, et al., "W/WN/Poly gate implementation for sub–130 nm vertical cell DRAM": 2001 IEEE Symposium on VLSI Technology Digest of Technical Papers (2 pages).
Tanaka, Masayuki, et al., "Realization of High Performance Dual Gate DRAMs without Boron Penetration by Application of Terachlorosilane Silicon Nitride Films"; 2001 IEEE Symposium on VLSI Technology Digest of Technical Papers (2 pages).
I.S. Choi, et al., "Formation mechanism of the multilayered-structure barrier of WNx/SI(100)"; 2002 American Institute of Physics, pp. 4339–4341, Appl. Phys. Lett., vol. 80, No. 23.
Hee Han, et al., "Reaction barrier formation of W/poly–Si gate by NH3 rapid thermal annealing applicable to 0.15 $\mu$m CMOS Devices"; 2000 IEEE, pp. 67–69.

* cited by examiner

Primary Examiner—David Nelms
Assistant Examiner—Dao H. Nguyen
(74) Attorney, Agent, or Firm—Okamoto & Benedicto LLP (57) ABSTRACT

In one embodiment, a gate of a transistor is formed by performing a first thermal treatment on a silicon layer, forming a metal stack over the silicon layer, and performing a second thermal treatment on the metal stack. The first thermal treatment may be a rapid thermal annealing step, while the second thermal treatment may be a rapid thermal nitridation step. The resulting gate exhibits relatively low interface contact resistance between the silicon layer and the metal stack, and may thus be advantageously employed in high-speed devices.

19 Claims, 8 Drawing Sheets

GATE ELECTRODE FOR MOS TRANSISTORS

BACKGROUND OF THE INVENTION

1. Field of the Invention

The present invention relates generally to integrated circuits, and more particularly, but not exclusively, to metal oxide semiconductor transistors.

2. Description of the Background Art

A metal oxide semiconductor (MOS) transistor comprises a source, a drain, and a gate. The source and the drain are typically formed in a substrate, such as a silicon substrate. The gate is formed over a channel region separating the source and the drain. By controlling a voltage on the gate, current flow through the channel region may be modulated. In a depletion-type MOS transistor, a control voltage may be applied on the gate to pinch-off the channel and prevent current flow between the source and the drain. In an enhancement-type MOS transistor, current flows between the source and the drain when a channel is formed in the channel region as a result of a control voltage on the gate overcoming a threshold voltage.

A MOS transistor is referred to as being "ON" when current flows through it, and "OFF" when there is no current flow. The speed at which a MOS transistor can be switched ON and OFF is referred to as "switching speed". Regardless of its type, a MOS transistor preferably has relatively fast switching speed. One way of improving switching speed is by lowering interface contact resistance between layers of the gate electrode.

SUMMARY

In one embodiment, a gate of a transistor is formed by performing a first thermal treatment on a silicon layer, forming a metal stack over the silicon layer, and performing a second thermal treatment on the metal stack. The first thermal treatment may be a rapid thermal annealing step, while the second thermal treatment may be a rapid thermal nitridation step. The resulting gate exhibits relatively low interface contact resistance between the silicon layer and the metal stack, and may thus be advantageously employed in high-speed devices.

These and other features of the present invention will be readily apparent to persons of ordinary skill in the art upon reading the entirety of this disclosure, which includes the accompanying drawings and claims.

DESCRIPTION OF THE DRAWINGS

The use of the same reference label in different drawings indicates the same or like components. Drawings are not necessarily to scale unless otherwise noted.

DETAILED DESCRIPTION

In the present disclosure, numerous specific details are provided such as examples of apparatus, materials, process steps, and structures to provide a thorough understanding of embodiments of the invention. Persons of ordinary skill in the art will recognize, however, that the invention can be practiced without one or more of the specific details. In other instances, well-known and irrelevant details are not shown or described to avoid obscuring aspects of the invention. For example, well-known masking steps are not shown or described in the interest of clarity.

FIGS. 1(a)–1(g) show sectional views schematically illustrating the fabrication of a MOS transistor in accordance with an embodiment of the present invention. In one embodiment, the MOS transistor being fabricated is an enhancement type. It should be understood, however, that the teachings of the present invention may be adapted to fabricate a depletion type MOS transistor.

As can be appreciated by those of ordinary skill in the art reading the present disclosure, the transistor being fabricated may be an NMOS transistor or a PMOS transistor depending on dopants employed in implantation steps. Additionally, note that the transistor being fabricated may be coupled to a complementary transistor or other transistors not specifically shown.

Figure 1A:
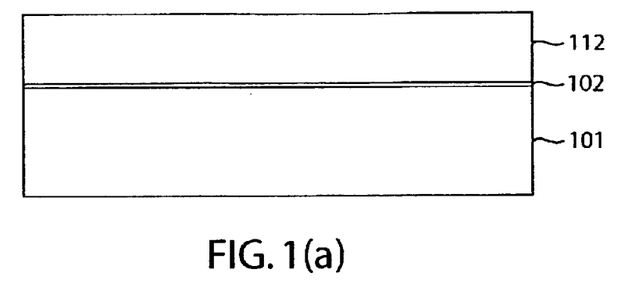
FIGS. 1(a)–1(g) show sectional views schematically illustrating the fabrication of a MOS transistor in accordance with an embodiment of the present invention.

Referring to FIG. 1(a), a gate oxide layer 102 is formed on a substrate 101. In one embodiment, gate oxide layer 102 comprises nitrided silicon dioxide thermally grown to a final thickness of about 23 Angstroms. That is, gate oxide layer 102 may be thermally grown and then annealed in a furnace containing nitric oxide. Substrate 101 may'be a silicon substrate.

Still referring to FIG. 1(a), a silicon layer is formed over gate oxide layer 102. In one embodiment, the silicon layer comprises an amorphous silicon layer 112. Amorphous silicon layer 112 may be deposited to a thickness of about 800 Angstroms by low pressure chemical vapor deposition (LPCVD). Thereafter, amorphous silicon layer 112 may be implanted with a P+ type dopant (e.g., boron) if the transistor being fabricated is a PMOS transistor, or an N+ type dopant (e.g., arsenic, phosphorous) if the transistor being fabricated is an NMOS transistor.

Figure 6:
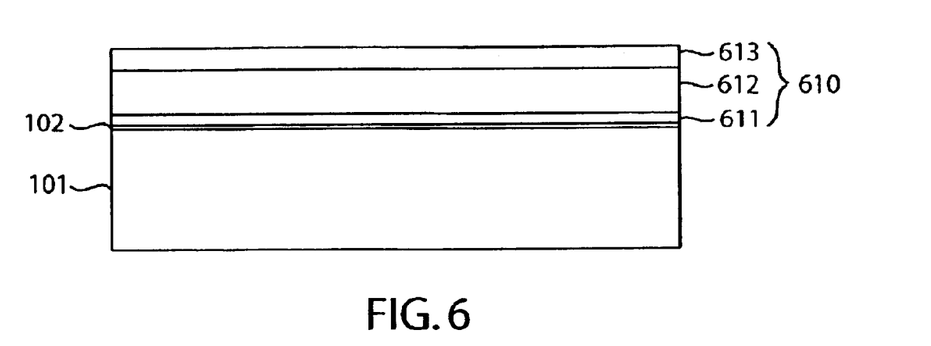
FIG. 6 schematically shows a material stack in accordance with an embodiment of the present invention.

In some embodiments, a material stack 610 shown in FIG. 6 may be used in lieu of amorphous silicon layer 112. Material stack 610 may comprise an amorphous silicon layer 611, a silicon-germanium (SiGe) layer 612, and an amorphous silicon layer 613. The layers of material stack 610 may be formed by LPCVD. Amorphous silicon layer 611, which helps protect gate oxide layer 102, may be formed to a thickness of about 50 Angstroms. Amorphous silicon layer 613 caps SiGe layer 612 to prevent formation of $GeTi_2$ during a subsequently performed rapid thermal nitridation step. SiGe layer 612 may be formed to a thickness of about 500 Angstroms to about 600 Angstroms, while amorphous silicon layer 613 may be formed to a thickness of about 150 Angstroms to about 250 Angstroms. Depending on the process, SiGe layer 612 may result in even lower interface resistance compared to a silicon layer comprising only of amorphous silicon. SiGe layer 612 may comprise $SiGe_X$, where X may be between about 0.20 to about 0.30. Material stack 610 may be processed similar to amorphous silicon layer 112.

Figure 1B:
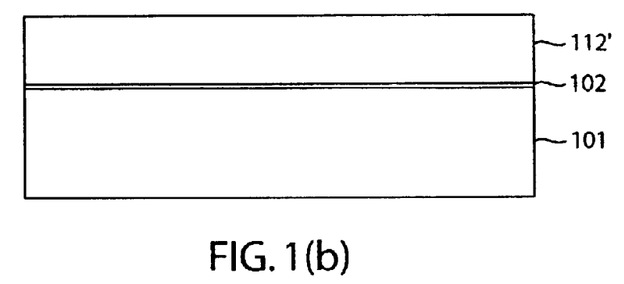

Continuing In FIG. 1(b), a first thermal treatment is performed on the sample of FIG. 1(a). In one embodiment, the first thermal treatment comprises a rapid thermal annealing step. The rapid thermal annealing step may be performed for about 10 seconds at a temperature of about 750° C., for example. Preferably, the rapid thermal annealing temperature is below about 800° C. to minimize boron diffusion in the gate oxide layer of PMOS transistors. The rapid thermal annealing step transforms amorphous silicon layer 112 to a polycrystalline silicon layer 112' (hereinafter "polysilicon 112'") and activates implanted dopants.

Rapid thermal annealing of silicon layer 112 before formation of additional gate materials thereon provides several advantages including annealing of damage caused by the implantation step, re-crystallization of amorphous silicon, and providing a smooth interface for a subsequently formed silicide layer. In the past, activation of dopants in a silicon layer is performed after the gate electrode is formed, usually after a source/drain implant step. The inventors believe that doing so increases the chances of having a silicide (e.g., titanium silicide) spike during the source/drain dopant activation step, which may lead to gate oxide failure. In embodiments of the present invention, performing a first thermal treatment on the silicon layer before forming additional gate materials thereon, and then performing a second thermal treatment on the metal stack as discussed below advantageously help prevent gate oxide breakdown.

After annealing amorphous silicon layer 112 to convert it to polysilicon layer 112', a clean step is performed on the sample of FIG. 1(b) to remove organics and native oxide that may have formed during the annealing step. In one embodiment, the clean step comprises an HF—last process followed by an IPA (isopropyl alcohol) dry process. A degas step may then be performed to evaporate adsorbed water. Thereafter, a sputter etch step may be optionally performed to remove about 30 Angstroms of equivalent silicon dioxide from the surface of polysilicon layer 112'. The sputter etch step, which may be performed in an environment comprising substantially of argon plasma, prepares polysilicon layer 112' for subsequent gate material deposition. Some processes may not require a sputter etch step.

Figure 1C:
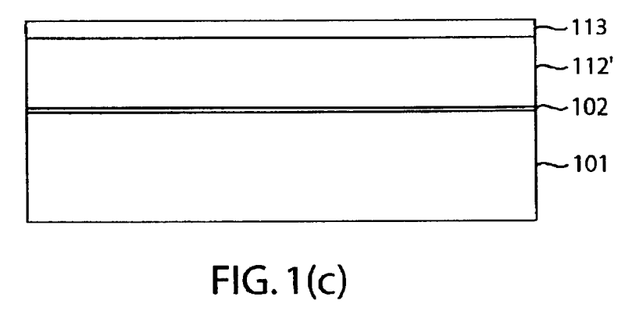

In FIG. 1(c), a first metal layer is formed over polysilicon layer 112'. The first metal layer may comprise titanium, tantalum, zirconium, or cobalt, for example. In one embodiment, the first metal layer comprises a titanium layer 113. Preferably, titanium layer 113 is formed relatively thin to minimize the thickness of the subsequently formed silicide layer. For example, titanium layer 113 may be formed to a thickness of about 35 Angstroms to about 65 Angstroms by physical vapor deposition (PVD) or collimated sputtering. A titanium layer 113 advantageously helps prevent a subsequently deposited diffusion barrier layer of tungsten nitride from reacting with polysilicon layer 112' to form silicon nitride. Silicon nitride is a dielectric, and may thus increase the contact resistance of a gate electrode to an unacceptable level if formed to a thickness greater than about 10 Angstroms, for example.

Figure 1D:
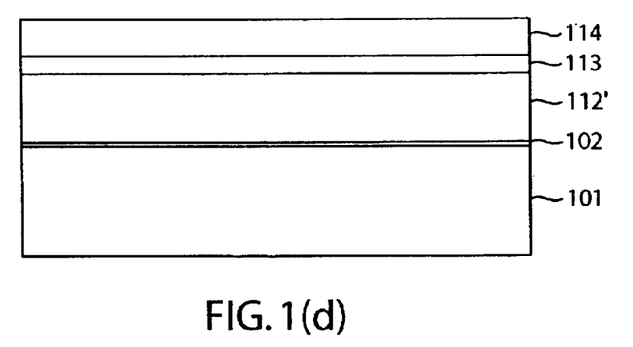

In FIG. 1(d), a refractory nitride layer is optionally formed over titanium layer 113. Examples of refractory nitrides that may be employed include tungsten nitride and titanium nitride. In one embodiment, the refractory nitride layer comprises a tungsten nitride layer 114. Tungsten nitride layer 114 may be deposited to a thickness of about 25 Angstroms by PVD, for example. Tungsten nitride layer 114 serves as a diffusion barrier layer. However, as will be more apparent below, a subsequently formed titanium nitride layer may also serve as a diffusion barrier layer. Thus, in some processes, a tungsten nitride layer 114 does not have to be formed over titanium layer 113.

Figure 1E:
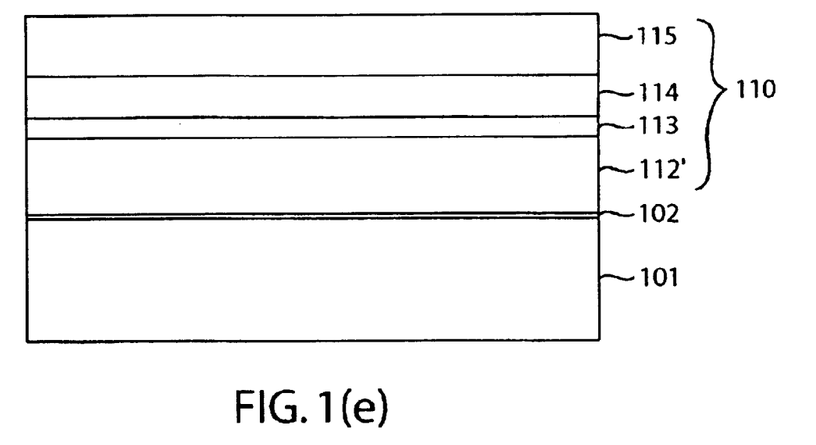

In FIG. 1(e), a second metal layer is formed over tungsten nitride layer 114. In one embodiment, the second metal layer comprises tungsten layer 115. Tungsten layer 115 may be employed as a metal shunt between gate electrodes in dual-doped transistors, for example. Tungsten layer 115 may be deposited to a thickness of about 375 Angstroms by PVD. Note that the thickness of tungsten layer 115, and other materials disclosed herein, may be varied to meet the needs of specific applications.

The stack of materials comprising polysilicon layer 112', titanium layer 113, tungsten nitride layer 114, and tungsten layer 115 form a gate electrode 110 of the transistor being fabricated. In one embodiment, titanium layer 113, tungsten nitride layer 114, and tungsten layer 115 are advantageously formed in-situ (i.e., without vacuum break) in a cluster tool, which may be of the same type as the Endura™ wafer processing system available from Applied Materials, Inc. of Santa Clara, Calif. The cluster tool may be configured to have a degas chamber, a sputter etch chamber, a collimated titanium sputtering chamber (or a titanium PVD chamber), and a tungsten PVD chamber. For example, the sample of FIG. 1(b) may be processed in the cluster tool as follows:

(a) in the degas chamber, evaporate solvents from the sample;

(b) in the sputter etch chamber, remove a thin layer from the sample using argon plasma;

(c) in the collimated titanium sputtering chamber, deposit titanium layer 113 over polysilicon layer 112';

(d) in the tungsten PVD chamber, deposit tungsten nitride layer 114 by sputtering a tungsten target with nitrogen flowing in the tungsten PVD chamber; and (e) in the same tungsten PVD chamber employed in step (d) immediately above, stop nitrogen flow in the tungsten PVD chamber to deposit tungsten layer 115 over tungsten nitride layer 114.

Figure 1F:
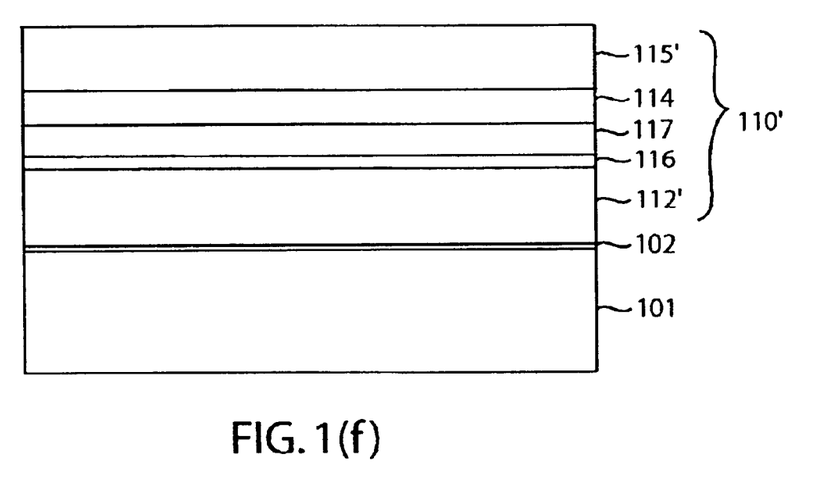

Referring now to FIG. 1(f), a second thermal treatment is performed on the sample of FIG. 1(e). In one embodiment, the second thermal treatment comprises a rapid thermal nitridation step. The rapid thermal nitridation step may be performed by heating the sample in an environment comprising nitrogen, such as ammonia. Ammonia is the preferred source of nitrogen because tungsten layer 115 promotes dissociation of ammonia, thereby providing sufficient nitrogen to convert a portion of titanium layer 113 to a nitride layer comprising a titanium nitride layer 117. The thermal nitridation step also results in the reaction of a portion of titanium layer 113 with polysilicon layer 112' to form a silicide layer comprising titanium silicide layer 116. Tungsten layer 115 is relabeled as "tungsten layer 115'" to indicate that some nitrogen component has been added to tungsten layer 115. Gate electrode 110 is relabeled as "gate electrode 110'" to indicate the resulting new metal stack comprising polysilicon layer 112', titanium silicide layer 116, titanium nitride layer 117, tungsten nitride layer 114, and tungsten layer 115'.

Gate electrode 110 provides several advantages heretofore unrealized. For one, the interface contact resistance between polysilicon layer 112' and the rest of gate electrode 110' is relatively low compared to other gate electrodes where silicon nitride forms instead of titanium silicide. This relatively low interface contact resistance translates to faster transistor switching speed, thereby improving the speed of integrated circuits employing such transistors.

Figure 7:
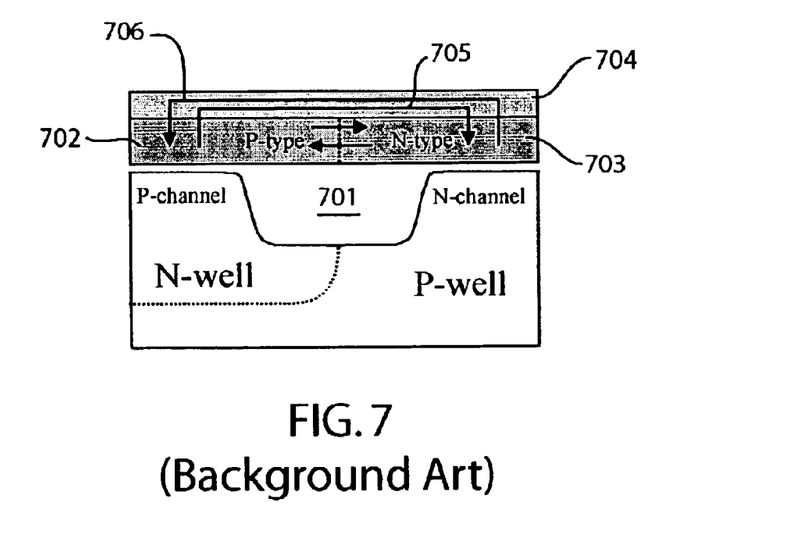
FIG. 7 schematically illustrates cross diffusion between two conventional gate electrodes.

As another advantage, titanium nitride layer 117 serves as a diffusion barrier layer to advantageously minimize cross-diffusion between gate electrode 110' and another gate electrode. FIG. 7 schematically illustrates cross diffusion between two conventional gate electrodes. In FIG. 7, regions 702 and 703 represent a p-type region and an n-type region, respectively, of a dual-doped polysilicon layer. Region 702 is part of one gate electrode, while region 703 is part of another gate electrode; they are coupled together by way of a metal shunt 704. The transistor including region 702 and the transistor including region 703 are separated by a shallow trench isolation (STI) 701. With conventional gate electrodes, it is possible for dopants to diffuse from one gate electrode to another through metal shunt 704 as indicated by arrows 706 and 705. This may lead to counter doping. In embodiments of the present invention, a diffusion barrier layer (e.g., titanium nitride layer 117) is formed in a gate electrode to help prevent cross diffusion via a metal layer serving as a shunt between gate electrodes. Thus, embodiments of the present invention may be employed to form gate electrodes of dual-doped transistors, for example.

In one embodiment, the rapid thermal nitridation step is performed by heating the sample of FIG. 1(e) to a temperature of about 675° C. to 725° C. (e.g., 700° C.) for about 30 seconds while flowing ammonia into the chamber. In another embodiment, the thermal nitridation step is performed as a two step process comprising a first heating step where the sample is heated to about 475° C. for about 60 seconds, followed by a second heating step where the sample is heated to about 750° C. for about 10 seconds—ammonia is flown into the chamber during both heating steps. The inventors believe that the flow rate of ammonia does not appreciably affect the thermal nitridation step. For example, the flow rate of ammonia may be in the range of about 1 to 10 standard liters per minute.

Preferably, the sample is not heated above 800° C. to prevent titanium nitride layer 117 from getting too thin, and thereby adversely affect its diffusion barrier capability. In one embodiment, the thermal nitridation step is performed to result in tungsten layer 115' having a thickness of about 400 Angstroms, titanium nitride layer 117 having a thickness of about 30 Angstroms to about 60 Angstroms and titanium silicide layer 116 having a thickness of about 35 Angstroms to about 65 Angstroms.

Figure 1G:
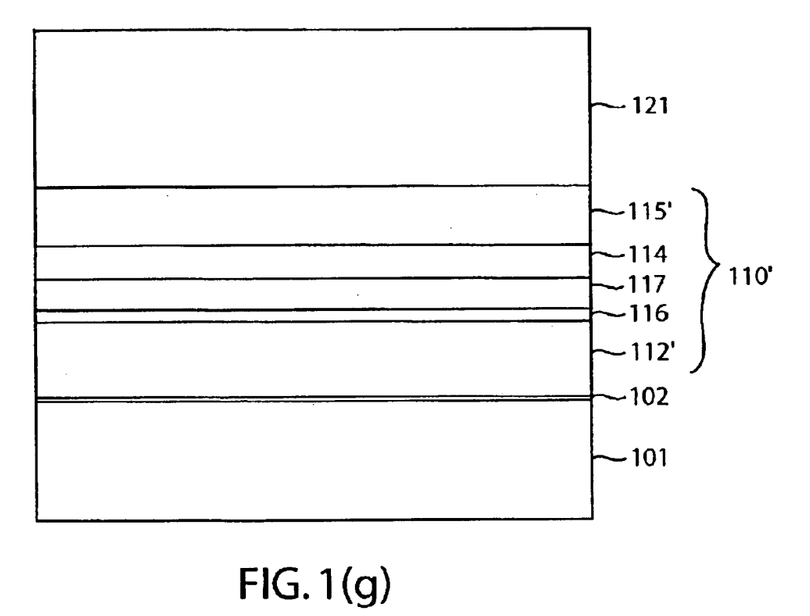

In FIG. 1(g), a capping layer is formed over tungsten layer 115'. The capping layer protects and electrically insulates gate electrode 110'. In one embodiment, the capping layer comprises a silicon nitride layer 121. Silicon nitride layer 121 may be formed to a thickness of about 2000 Angstroms by plasma-enhanced chemical vapor deposition (PECVD) at a temperature of about 400° C. Silicon nitride layer 121 may also be deposited using a low-pressure chemical vapor deposition (LPCVD) process at a relatively low-temperature (e.g., about 600° C. or less, preferably about 550° C.) to prevent unwanted reactions in the gate electrode.

After the formation of silicon nitride layer 121, conventional semiconductor processing techniques may be employed to complete the transistor being fabricated. For example, the sample of FIG. 1(g) may be patterned and etched to form a gate. Spacers may be formed on the sidewalls of the gate. Implantation and activation steps may then be performed to create a source and a drain. Tungsten nitride layer 114 loses its nitrogen component during the activation of the source and the drain. This leads to the tungsten of the then tungsten nitride layer 114 becoming a part of tungsten layer 115'.

Figure 2:
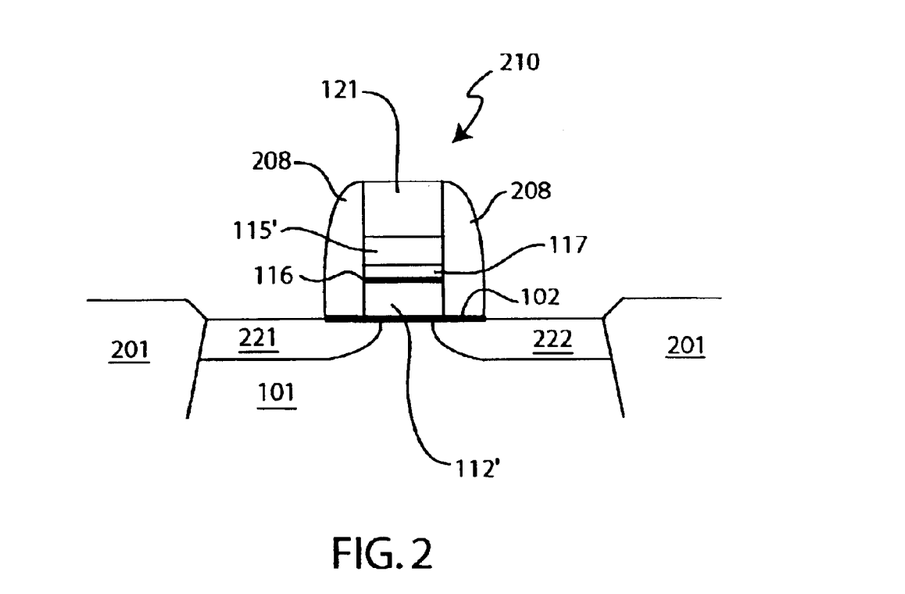
FIG. 2 schematically shows a MOS transistor in accordance with an embodiment of the present invention.

FIG. 2 shows an example where a gate 210 including gate electrode 110' is formed in an NMOS transistor region between isolation structures 201. In the example of FIG. 2, a source 221 and a drain 222 are formed in a P-type substrate 101. Between source 221 and drain 222 is gate 210 comprising silicon nitride layer 121, tungsten layer 115', titanium nitride layer 117, titanium silicide layer 116, polysilicon layer 112', and gate oxide layer 102. Selective oxidation may be performed on the sidewalls of polysilicon layer 112' prior to the formation of spacers 208 (e.g., silicon nitride). As can be appreciated, gate electrode 110' may be employed in various types of MOS transistors. Tungsten nitride layer 114 is no longer depicted in FIG. 2 as it has lost its nitrogen component during formation of source 221 and drain 222, with its remaining tungsten becoming a part of tungsten layer 115'.

Figure 3:
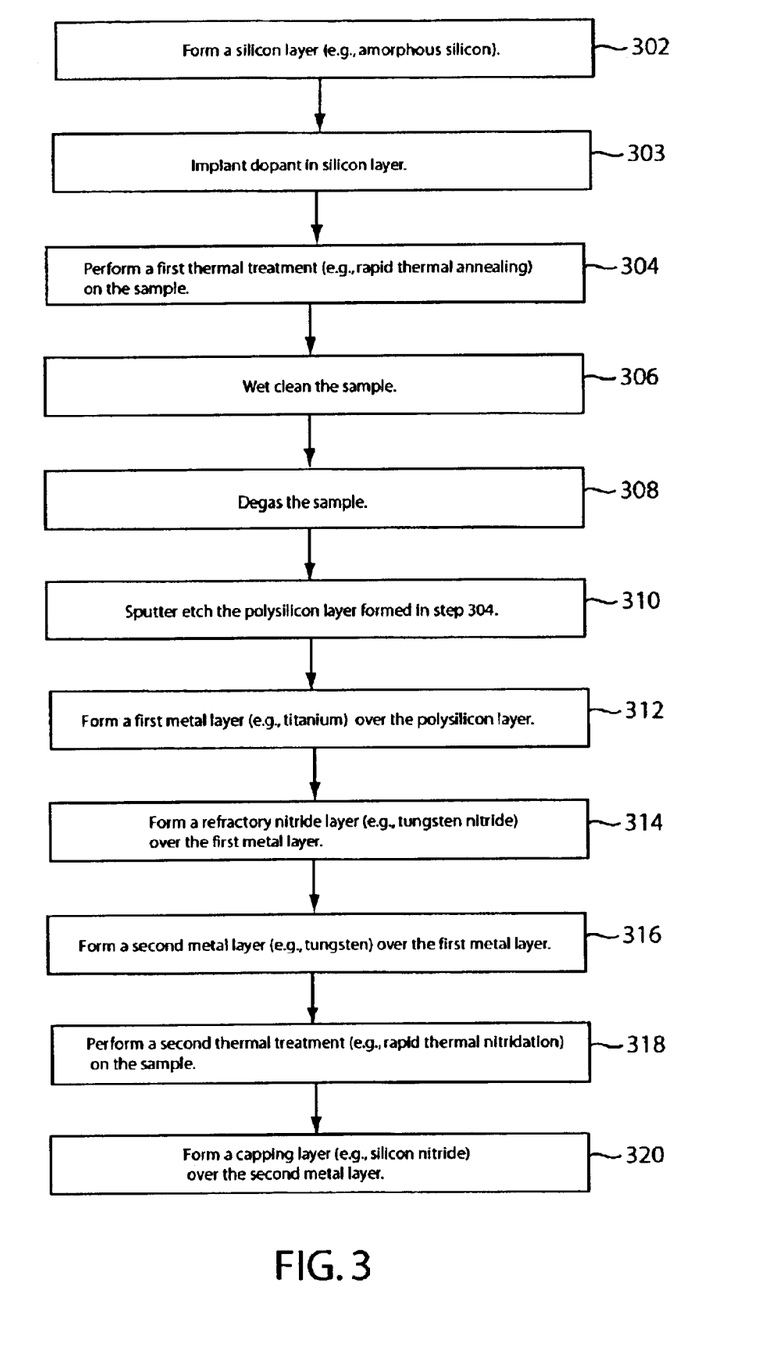
FIG. 3 shows a flow diagram of a method of forming a gate electrode of a MOS transistor in accordance with an embodiment of the present invention.

Referring now to FIG. 3, there is shown a method of forming a gate electrode of a MOS transistor in accordance with an embodiment of the present invention. Beginning in step 302, a silicon layer is formed over a gate oxide layer, which in turn is formed over a substrate. In one embodiment, the silicon layer comprises a layer of amorphous silicon. As discussed in connection with FIG. 6, the silicon layer may also be a material stack comprising a layer of silicon-germanium.

In step 303, dopants are implanted in the silicon layer, which in this example comprises amorphous silicon. Either P-type or N-type dopants may be implanted in the amorphous silicon layer depending on whether the transistor being fabricated is a PMOS or an NMOS transistor.

In step 304, a first thermal treatment is performed to activate the implanted dopants and to transform the amorphous silicon layer to a polysilicon layer. The first thermal treatment advantageously anneals damage caused by the implantation step, recrystallizes the amorphous silicon crystal, and provides a smooth interface for a subsequently formed silicide layer. The first thermal treatment may comprise a rapid thermal annealing step.

In step 306, a wet clean step is performed to remove organics and native oxide that may have formed on the sample in step 304.

In step 308, a degas step is performed to evaporate adsorbed water from the sample.

In step 310, a sputter etch step is optionally performed to remove a relatively thin layer (e.g., about 30 Angstroms of equivalent silicon dioxide) from the polysilicon layer formed in step 304. In one embodiment, the polysilicon layer is sputter etched in an environment comprising substantially of argon plasma.

In step 312, a first metal layer is formed over the polysilicon layer. In one embodiment, the first metal layer comprises a titanium layer.

In step 314, a refractory nitride layer is formed over the first metal layer. In one embodiment, the refractory nitride layer comprises a tungsten nitride layer.

In step 316, a second metal layer is formed over the refractory nitride layer. In one embodiment, the second metal layer comprises a tungsten layer.

In step 318, a second thermal treatment is performed to form a silicide layer and a barrier layer. In one embodiment, the second thermal treatment comprises a thermal nitridation step where the sample is heated in the presence of a nitrogen source. The thermal nitridation step converts the titanium layer to a titanium silicide layer and a titanium nitride layer. The titanium silicide layer is a result of the polysilicon layer reacting with the titanium layer, while the titanium nitride layer is a result of the titanium layer receiving nitrogen from the nitrogen source (e.g., ammonia).

In step 320, a capping layer is formed over the tungsten layer. In one embodiment, the capping layer comprises silicon nitride.

Figure 4:
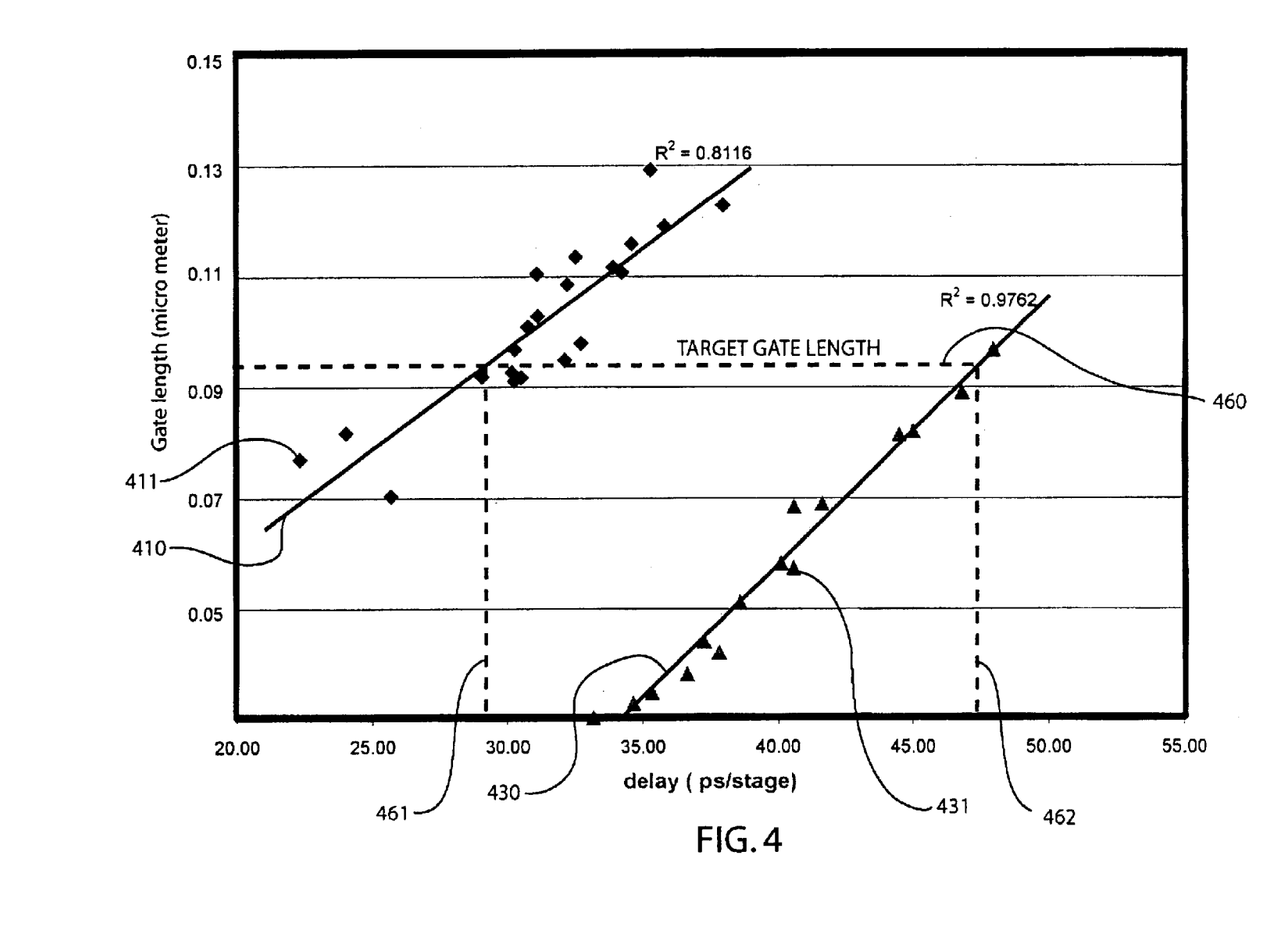
FIG. 4 shows plots of gate length versus delay for two types of transistors used in an experiment.

FIG. 4 shows plots of gate length versus delay for two types of transistors used in an experiment. Transistors of the first type have a gate electrode formed in accordance with an embodiment of the present invention, and are similar to that shown in FIG. 2. Transistors of the second type, which serve as control samples, have a structure later described with reference to FIG. 5. Each transistor in the experiment was configured in a multi-stage ring oscillator to measure its propagation delay. In FIG. 4, the vertical axis represents gate length in micro meters ($\mu$m), while the horizontal axis represents delay in pico seconds per stage (ps/stage). The diamond-shaped data points are for transistors of the first type, while the triangular-shaped data points are for transistors of the second type. For example, data point 411 shows that the delay through a transistor of the first type having a gate that is about 0.075 $\mu$m long is about 22.5 ps/stage. Similarly, data point 431 shows that the delay through a transistor of the second type having a gate that is about 0.057 $\mu$m long is about 41.0 $\mu$m ps/stage.

Figure 5:
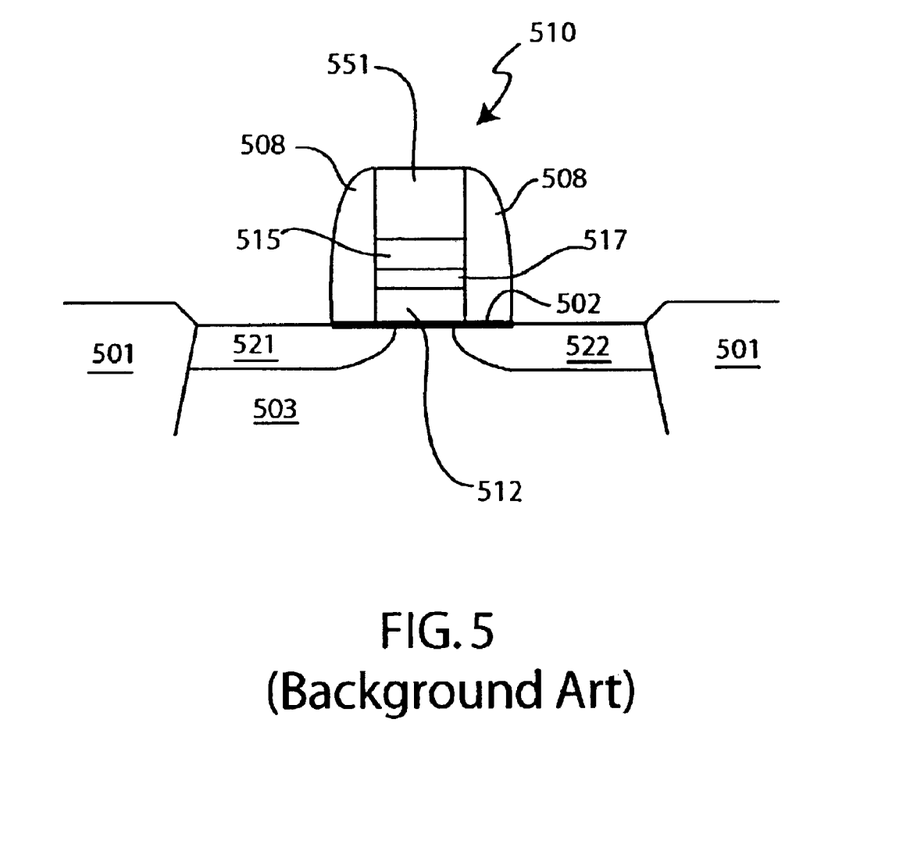
FIG. 5 schematically shows a transistor employed as a control sample in an experiment.

FIG. 5 schematically shows a transistor of the second type employed in the experiment. The transistor of the second type includes a gate 510 formed in an NMOS transistor region between isolation structures 501. A source 521 and a drain 522 are formed in a P-type substrate 503. Between source 521 and drain 522 is gate 510 comprising silicon nitride layer 551 (approximately 1200 Angstroms thick), tungsten layer 515 (approximately 325 Angstroms thick), tungsten-nitride layer 517 (approximately 75 Angstroms thick), polysilicon layer 512 (approximately 800 Angstroms thick), and gate oxide layer 502 (approximately 23 Angstroms thick). Selective oxidation is performed on the sidewalls of polysilicon layer 512 prior to the formation of spacers 508 (e.g., silicon nitride). In the experiment, transistors of the second type serve as control samples. Transistors of the second type were not subjected to a polysilicon anneal step prior to metal stack deposition or to a thermal nitridation step.

Referring back to FIG. 4, plot 410 is a linear plot of all data points for transistors of the first type (i.e., transistors fabricated in accordance with an embodiment of the present invention), while plot 430 is a linear plot of all data points for transistors of the second type (i.e., transistors employed as control samples). As is evident from FIG. 4, transistors manufactured in accordance with an embodiment of the present invention resulted in shorter propagation delay for any given gate length. For example, at a target gate length of about 0.094 $\mu$m (see dashed line 460), transistors of the first type resulted in a delay of about 29.0 ps/stage (see dashed line 461). In contrast, for the same target gate length, transistors of the second type resulted in a delay of about 47.5 ps/stage (see dashed line 462).

Figure 8:
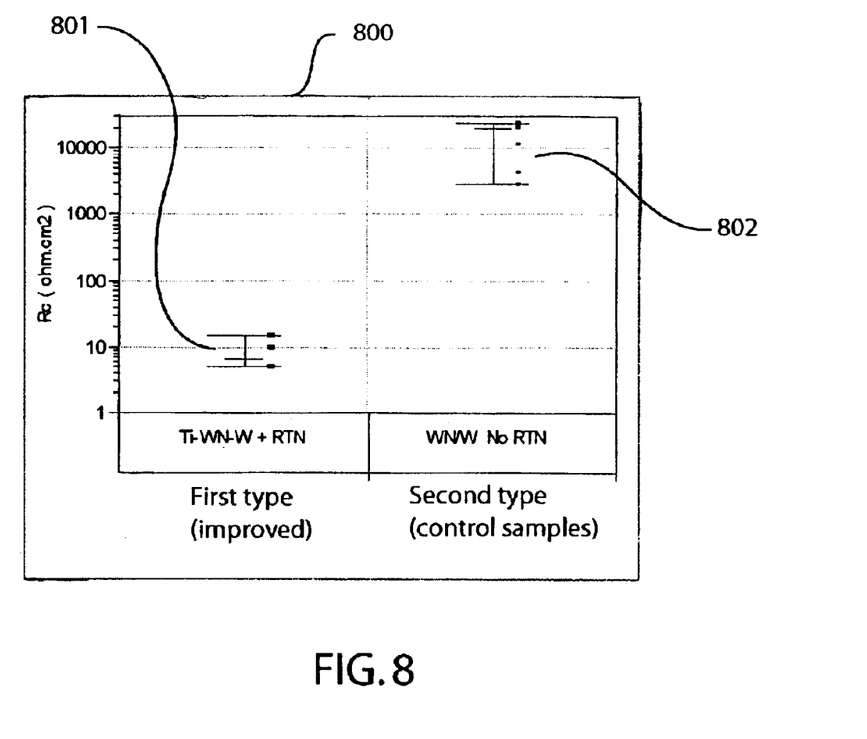
FIG. 8 shows the results of contact resistance measurements in one experiment involving transistors that are in accordance with an embodiment of the present invention.

FIG. 8 shows the results of contact resistance measurements performed on the transistors involved in the aforementioned experiment. In FIG. 8, the vertical axis is logarithmic and represents gate electrode contact resistance in ohm-centimeter square ($\Omega$cm$^2$). The contact resistance is measured vertically from the bottom layer to the top layer of the gate electrode. Plots 801 and 802 show the distribution of contact resistance for transistors of the first type and second type, respectively. Comparing plot 801 to 802, it is evident that transistors of the first type result in much lower contact resistance compared to transistors of the second type.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of forming a gate of a transistor, the method comprising:
   annealing a silicon layer;
   forming a metal stack over the silicon layer; and
   exposing the metal stack in a heated environment comprising nitrogen to convert a portion of the metal stack to a silicide layer;
   wherein forming the metal stack comprises:
   forming a titanium layer over the silicon layer;
   forming a tungsten nitride layer over the titanium layer; and
   forming a tungsten layer over the tungsten nitride layer.

2. The method of claim 1 wherein the silicon layer comprises amorphous silicon.

3. The method of claim 1 wherein the silicon layer comprises a material stack comprising silicon-germanium.

4. The method of claim 1 wherein the silicide layer comprises titanium suicide.

5. The method of claim 1 wherein exposing the metal stack in the heated environment comprising nitrogen forms a titanium suicide layer on the silicon layer and a titanium nitride layer on the titanium silicide layer.

6. The method of claim 1 wherein the heated environment comprises ammonia.

7. The method of claim 1 further comprising:
   forming a capping layer over the metal stack.

8. The method of claim 7 wherein the capping layer comprises silicon nitride.

9. A method of forming a gate of a transistor, the method comprising:
   annealing a silicon layer;
   forming a first metal layer over the silicon layer;
   forming a refractory nitride layer over the first metal layer;
   forming a second metal layer over the silicon layer; and
   performing a heat treatment to convert at least a portion of the first metal layer to a silicide layer.

10. The method of claim 9 wherein the silicon layer comprises amorphous silicon.

11. The method of claim 9 wherein the silicon layer comprises a metal stack comprising silicon-germanium.

12. The method of claim 9 wherein the first metal layer comprises titanium formed to a thickness equal to or less than about 65 Angstroms.

13. The method of claim 9 wherein the refractory nitride layer comprising tungsten nitride.

14. The method of claim 9 wherein the second metal layer comprises tungsten.

15. The method of claim 9 wherein converting at least the portion of the first metal layer to the suicide layer also converts another portion of the first metal layer to a diffusion barrier layer comprising titanium nitride.

16. The method of claim 9 wherein performing a heat treatment comprises:

heating the silicon layer, the first metal layer, the refractory nitride layer, and the second metal layer in an environment comprising ammonia.

17. A method of forming a gate electrode of a transistor, the method comprising:

annealing an amorphous silicon layer to convert the amorphous silicon layer to a polycrystalline silicon layer;

forming a stack of materials over the polycrystalline silicon layer; and heat treating the polycrystalline silicon layer and the stack of materials in an environment comprising nitrogen to form a silicide layer between the polycrystalline silicon layer and the stack of materials and to form a barrier layer in the stack of materials.

18. The method of claim 17 wherein the silicide layer comprises titanium silicide.

19. The method of claim 17 wherein the environment comprises ammonia.

* * * * *

UNITED STATES PATENT AND TRADEMARK OFFICE
CERTIFICATE OF CORRECTION

PATENT NO. : 6,902,993 B2
DATED : June 7, 2005
INVENTOR(S) : Blosse et al.

It is certified that error appears in the above-identified patent and that said Letters Patent is hereby corrected as shown below:

Column 8,
Lines 29-30, claim 4 should read:
-- 4. The method of claim 1 wherein the silicide layer comprises titanium silicide. --.
Lines 31-34, claim 5 should read:
-- 5. The method of claim 1 wherein exposing the metal stack in the heated environment comprising nitrogen forms a titanium silicide layer on the silicon layer and a titanium nitride layer on the titanium silicide layer. --.
Lines 61-64, claim 15 should read:
-- 15. The method of claim 9 wherein converting at least the portion of the first metal layer to the silicide layer also converts another portion of the first metal layer to a diffusion barrier layer comprising titanium nitride. --.

Signed and Sealed this

Twenty-third Day of August, 2005

JON W. DUDAS
*Director of the United States Patent and Trademark Office*